United States Patent [19]

Kozuka et al.

[11] Patent Number: 5,245,201
[45] Date of Patent: Sep. 14, 1993

[54] PHOTOELECTRIC CONVERTING DEVICE AND IMAGE PROCESSING APPARATUS UTILIZING THE SAME

[75] Inventors: Hiraku Kozuka, Hiratsuka; Shigetoshi Sugawa; Ihachiro Gofuku, both of Atsugi, all of Japan

[73] Assignee: Canon Kabushiki Kaisha, Tokyo, Japan

[21] Appl. No.: 815,029

[22] Filed: Dec. 31, 1991

[30] Foreign Application Priority Data

Jan. 11, 1991 [JP] Japan .................................. 3-012596

[51] Int. Cl.⁵ ............................................. H01L 27/14
[52] U.S. Cl. ........................................ 257/53; 257/65; 257/446; 257/458; 257/444
[58] Field of Search ................. 357/30 G, 30 H, 2; 257/53, 55, 65, 75, 443, 444, 446, 458

[56] References Cited

U.S. PATENT DOCUMENTS

| | | | |
|---|---|---|---|
| 4,523,214 | 6/1985 | Hirose et al. | 357/30 |
| 4,644,406 | 2/1987 | Nishigaki et al. | 358/213 |
| 4,971,919 | 11/1990 | Yamazaki | 437/2 |
| 5,084,747 | 1/1992 | Miyawaki | 350/30 G |
| 5,091,764 | 2/1992 | Asaoka et al. | 357/67 |

FOREIGN PATENT DOCUMENTS 3503048  8/1985  Fed. Rep. of Germany .
61-216358  9/1986  Japan .

Primary Examiner—Andrew J. James
Assistant Examiner—Courtney A. Bowers
Attorney, Agent, or Firm—Fitzpatrick, Cella, Harper & Scinto

[57] ABSTRACT

A photoelectric converting device has non-monocrystalline semiconductor layers of PIN structure laminated on mutually isolated plural pixel electrodes. P- or N-doped layer on the pixel electrode contains at least a microcrystalline structure. N- or P-doped layer on the area other than the pixel electrode is amorphous.

8 Claims, 3 Drawing Sheets

PHOTOELECTRIC CONVERTING DEVICE AND IMAGE PROCESSING APPARATUS UTILIZING THE SAME

BACKGROUND OF THE INVENTION

1. Field of the Invention

The present invention relates to a photoelectric converting device and an image processing apparatus utilizing the same.

2. Related Background Art

Among such photoelectric converting devices, there are well known those of a PIN structure utilizing a non-monocrystalline semiconductor. In particular, amorphous semiconductors, represented by amorphous silicon, are widely utilized in one-dimensional line sensors and laminate-structure solid-state image pickup devices, as they can be prepared at a low temperature and in a large area.

However, in such photoelectric converting devices of PIN structure, the P- or N-layer between the pixel electrodes is electrically insulated in order to prevent the leak of signal charge between the pixels, namely crosstalk. This will be explained in more detail with reference to FIGS. 1 and 2.

FIG. 1 is a schematic cross-sectional view of a photoelectric converting device, including a substrate 1301, pixel electrodes 1302, a photoconductive film 1303 composed for example of amorphous silicon, and a transparent electrode 1304.

Such device can be prepared, as disclosed for example in the Japanese Patent Laid-Open Patent No. 58-40985, by forming the pixel electrodes 1302 on the substrate 1301, then forming a photoconductive film 1303, photolithographically eliminating said photoconductive film on the pixel isolation areas, and forming the transparent electrodes 1304.

FIG. 2 is a schematic cross-sectional view of another photoelectric converting device, including a substrate 2401, pixel electrodes 2402, high-density impurity layer 2403, a pixel isolation area 2403', a photoconductive film 2404 for example of amorphous silicon, and a transparent electrode 2405.

The device shown in FIG. 2 can be prepared by forming the pixel electrodes 2402 on the substrate 2401, then forming the high-concentration impurity layer (N- or P-layer) 2403, implanting oxygen or nitrogen ions only in the pixel isolation area 2403' by a photolithographic process, thereby electrically insulating the pixel electrodes, and thereafter forming the photoconductive film 2404 and the transparent electrode 2405. This method is disclosed for example in the Japanese Patent Laid-Open Application No. 60-47574. There is also known a method of eliminating only the pixel isolation area 2403' by etching, as disclosed in the Japanese Patent Laid-Open Patent No. 61-49569.

However, the above-mentioned methods are often associated with various drawbacks. For example, in the example shown in FIG. 1, the etching of the photoconductive film on the pixel isolation area may form a defect in the cross section of the device, thereby causing deterioration of the characteristics, particularly an increase in the dark current. Also the step in the photoelectric converting film frequently results in defects in the transparent electrode, such as breakage.

Also in the example shown in FIG. 2, after the formation of N- or P-layer, the formation of the pixel isolation area by ion implantation or etching requires a photolithographic process, which inevitably deteriorates the surface of said N- or P-layer to generate defects in the N/I or P/I interface, thereby causing deterioration of the device characteristics. Thus, in the above-explained structures, the prevention of deterioration of characteristics of PIN device cannot be often made compatible with the isolation of devices.

SUMMARY OF THE INVENTION

In consideration of the foregoing, the present invention is to provide a photoelectric converting device capable of satisfactorily achieving device isolation and preventing the deterioration of characteristics of a PIN device.

DETAILED DESCRIPTION OF THE PREFERRED EMBODIMENTS

Figure 1:
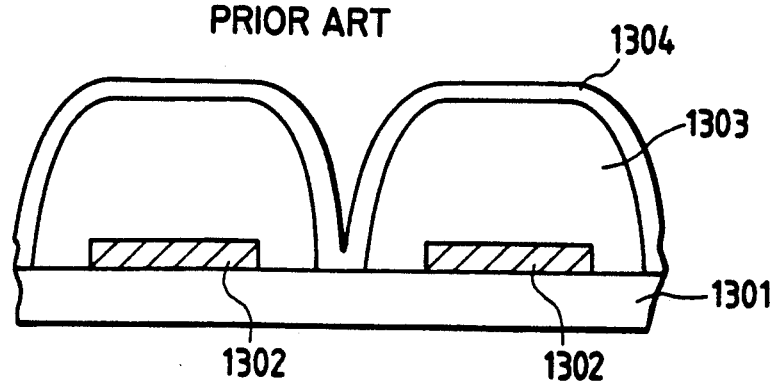
FIG. 1 is a schematic cross-sectional view of an example of photoelectric converting device.

The above-mentioned objects can be attained, according to the present invention, by a photoelectric converting device, having a non-monocrystalline semiconductor layer of PIN structure which is laminated on mutually isolated plural pixel electrodes, wherein a P- or N-doped layer on said pixel electrodes includes a microcrystalline structure, and a P- or N-doped layer on the area other than said pixel electrodes is composed of an amorphous semiconductor layer.

According to the present invention, the P-or N-layer only on the pixel electrode is selectively formed by a non-monocrystalline layer including the microcrystalline structure, so that the PIN structure can be formed in a continuous manner and the deterioration of the device characteristics in the patterning process can be prevented. The device isolation is also made possible by the difference in conductivity between the doped layer including the microcrystalline structure and the amorphous doped layer.

The microcrystalline structure used herein is defined by a structure in which small crystalline particles of a size of several ten to several hundred Angstroms are mixed in an amorphous material. The size of the crystalline particles can be determined, for example, by X-ray diffractometry or by Raman spectroscopy.

Also in the present invention, the device isolation is possible by providing a ratio of conductivity, at least equal to 3.0 and preferably equal to or larger than 4.0, between the doped layer including the microcrystalline structure and the doped amorphous layer.

Also the present invention can realize an arbitrary structure by suitably selecting the materials for the pixel electrodes and for other areas, and the method and conditions of film formation, in such a manner that the N- or P-layer on the pixel electrode only has the microcrystalline structure in a selective manner. It is already known that, in the preparation of N-silicon by ordinary RF plasma CVD employing $SiH_4$, $H_2$ and $PH_3$ gases, a structural change from amorphous silicon to silicon including microcrystalline structure is possible by an increase in $H_2$ flow rate. Also, the present inventors have found, in the vicinity of the condition causing crystallization of the silicon film formed on a glass substrate, a condition inducing growth of silicon including microcrystalline structure on metals or polycrystalline silicon and growth of amorphous silicon on glass substrate or silicon dioxide. Thus, the present invention can be effectively attained by suitable selection of such preparing conditions. In such film formation, there may be introduced fluorine- or chlorine-containing gas, and particularly the film formation with fluorine-containing gas provides satisfactory selectivity, and widens the freedom of design, thus being advantageous for realizing the structure of the present invention. Examples of such film formation include HR-CVD (hydrogen radical enhanced chemical vapor deposition) employing $SiF_4$, $H_2$, and chemical vapor deposition employing $SiH_4$, $F_2$.

A preferred substance for the non-monocrystalline semiconductor layer to be employed in the present invention is silicon, but at least one of Ge, C, O, N etc. may be selectively added for adjusting the band gap, for obtaining desired characteristics.

In the present invention, the doped layer on the pixel electrode may be of N- or P-type. In case of N-type, the layers are superposed in the order of pixel electrode/N-/I/P, and, in case of P-type, the layers are superposed in the order of pixel electrode/P/I/N. In case the non-monocrystalline semiconductor is principally composed of elements of Group IV of the Periodic Table, such as Si, C or Ge, the P-type impurity is composed of elements of Group IV of the Periodic Table, among which preferred are B and Ga. Also N-type impurity is composed, of elements of Group III of the Periodic Table, among which preferred are P, As and Sb.

The pixel electrode in the present invention can be composed of a metal such as Al, Cr, Ni, W, Ti Mo, In, Pt or Au, an alloy containing such metal, a metal oxide such as ITO, $ZnO_x$, $IrO_x$ or $SnO_x$, or polycrystalline Si containing an impurity at a high concentration, and the component other than the pixel electrode can be composed of an inorganic substance such as glass, $SiO_2$, $SiN_x$ or $SiON$, or an organic substance such as polyimide.

In the present invention, since the doped layer alone on the pixel electrode is selectively made to constitute a microcrystalline line structure, the combination of the pixel electrode and the PIN device may assume a structure of polycrystalline $N^+$-Si/N-Si/amorphous I-Si/-microcrystalline P-SiC or Cr/N-SiC/amorphous I-SiGe/amorphous P-Si, for obtaining desired characteristics.

Example

In the following the present invention will be clarified further by embodiments thereof shown in the attached drawings.

Figure 3:
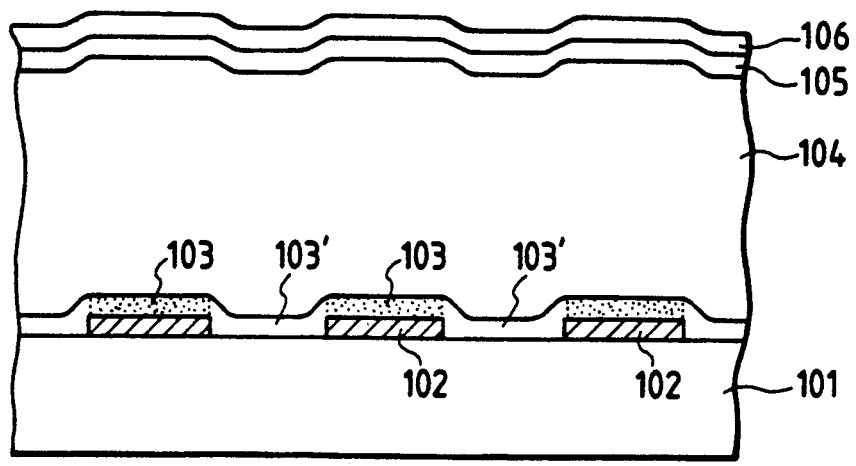
FIG. 3 is a schematic cross-sectional view of an embodiment of the photoelectric converting device of the present invention.

FIG. 3 shows an embodiment of the photoelectric converting device of the present invention. Said device can be prepared by forming a Cr film of a thickness of 1000 Å by sputtering on a glass substrate, then forming the pixel electrodes 102 by an ordinary photolithographic process, then continuously forming the microcrystalline N-silicon layer 103, and amorphous N-silicon layer 103' with a thickness 500 Å under a selectively crystallizing condition, the amorphous I-silicon layer 104 with a thickness of 8000 Å and the microcrystalline P-silicon layer 105 with a thickness of 200 Å by RF plasma CVD, and finally forming the transparent electrode 106 of ITO with a thickness 1000 Å. An example of the depositing conditions of said N, I and P layers is shown in Table 1.

TABLE 1

|  | N-layer | I-layer | P-layer |
| --- | --- | --- | --- |
| $SiH_4$ (SCCM) | 10 | 20 | 10 |
| $H_2$ (SCCM) | 110 | 60 | 200 |
| $PH_3/SiH_4$ (ppm) | 5000 | — | — |
| $B_2H_6/SiH$ (ppm) | — | — | 3000 |
| Reaction pressure (mTorr) | 50 | 50 | 50 |
| RF power density (W/cm$^2$) | 0.06 | 0.03 | 0.06 |
| Substrate temp. (°C.) | 350 | 350 | 350 |

Figure 2:
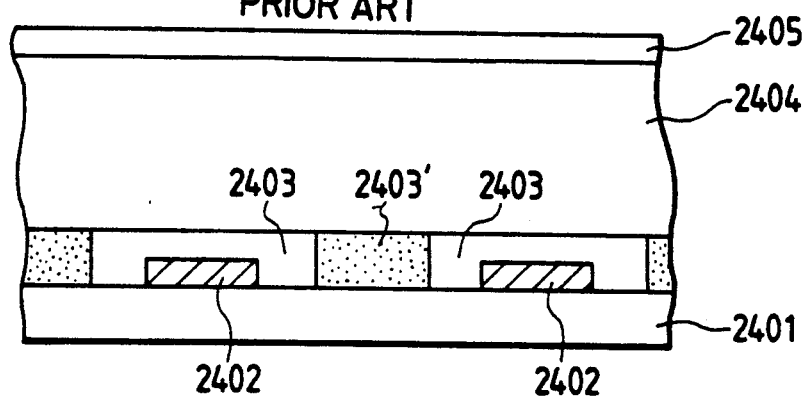
FIG. 2 is a schematic cross-sectional view of another example of photoelectric converting device.

Also the photoelectric converting devices of the structures shown in FIGS. 1 and 2 were prepared under similar conditions as those of the above-explained embodiment, and were subjected to the evaluation of the dark current. The dark current of the above-explained embodiment under the application of an inverse bias voltage of 7 V, was about $3 \times 10^{-10}$ A/cm$^2$, while that of the structures shown in FIGS. 1 and 2 was about $1 \times 10^{-9}$ A/cm$^2$, whereby the superiority of the method without the etching step could be confirmed. Also the structure of the present invention showed satisfactory device isolation characteristics.

In the following there will be explained an embodiment in which the photoelectric converting device of the foregoing embodiment is superposed on a scanning/readout circuit proposed by the present applicant in the U.S. Pat. No. 4,962,412.

Figure 4A:
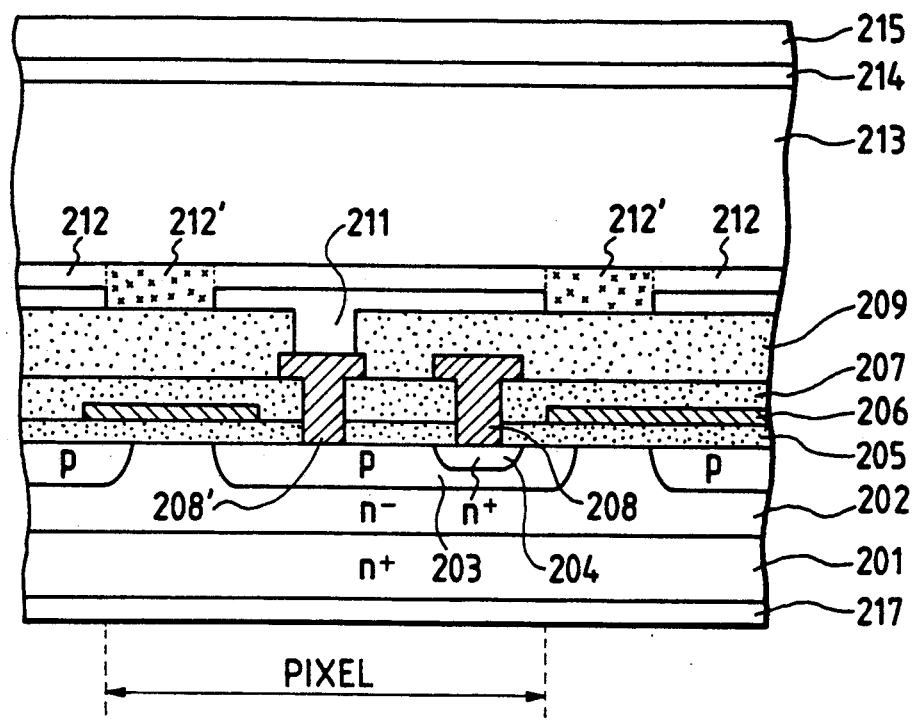
FIG. 4A is a schematic cross-sectional view of a light-receiving area and related structures of another embodiment of the photoelectric converting device of the present invention.

Referring to FIG. 4A, on an n-silicon substrate 201, there is epitaxially grown an $n^{--}$-layer 202 constituting a collector area, and a p-base area 203 and an $n^+$-emitter area 204 are formed therein to constitute a bipolar transistor.

Said p-base area is isolated from the adjacent pixel, and, on a space between the neighboring p-base areas, there is formed a gate electrode 206 across an oxide film 205. Thus a p-channel MOS transistor is constructed, in which the neighboring p-base areas serve respectively as source and drain electrodes. The gate electrode 206 also serves as a capacitor for controlling the potential of the p-base area 203.

After the formation of an insulation layer 207, an emitter electrode 208 and a base electrode 208' are formed.

Then an $SiO_2$ insulation layer 209 is formed, and an $n^+$ polycrystalline silicon electrode 211 is formed by CVD to isolate the pixel. Said electrode 211 is electrically connected to the electrode 208'.

Subsequently RF plasma CVD is conducted to continuously form a microcrystalline N-silicon layer 212 and an amorphous N-silicon layer 212' of a thickness of 1000 Å under a selectively crystallizing condition, an amorphous I-silicon layer 213 of a thickness of 10000 Å and a microcrystalline P-silicon layer 214 of a thickness of 1000 Å. Finally an ITO transparent electrode 215 of a thickness of 1000 Å is formed.

A collector electrode 217 is in ohmic contact with the rear face of the substrate 201.

Figure 4B:
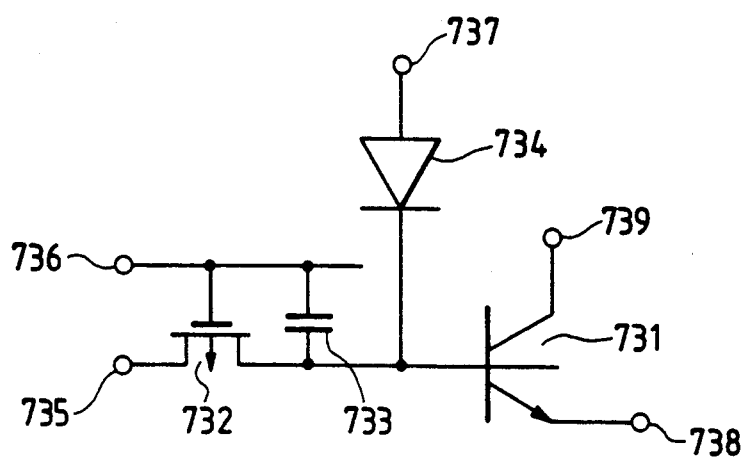
FIG. 4B is an equivalent circuit diagram of a pixel of the photoelectric converting device shown in FIG. 4A.

Consequently the equivalent circuit of a pixel is represented by FIG. 4B. The base of a bipolar transistor 731 consisting of crystalline silicon is connected to a p-channel MOS transistor 732, a capacitor 733 and a photoelectric converting device 734 the same as in the foregoing embodiment. There are also shown a terminal 735 for giving a potential to the base, a terminal 736 for driving the p-channel MOS transistor 732 and the capacitor 733, a sensor electrode 737, an emitter electrode 738 and a collector electrode 739.

Figure 4C:
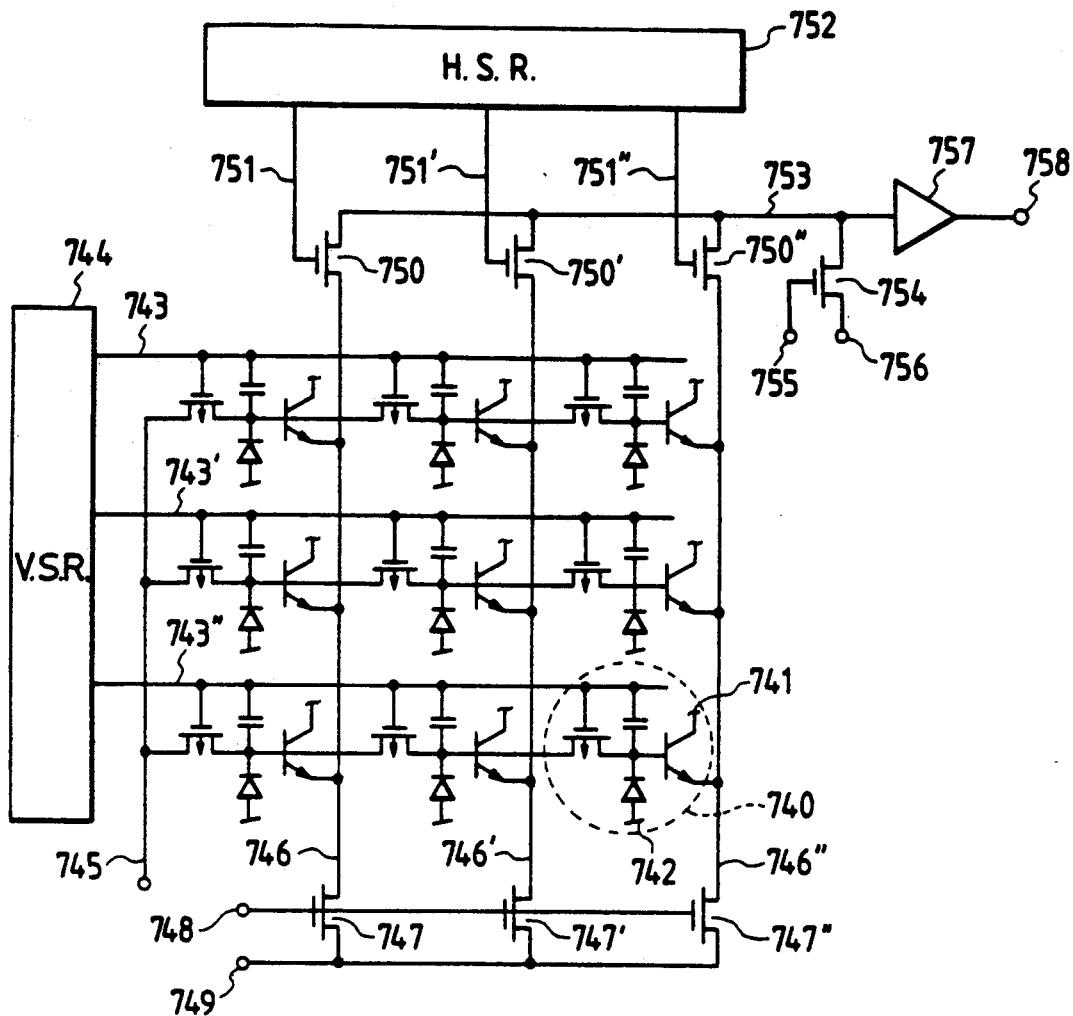
FIG. 4C is an equivalent circuit diagram and a block diagram of the entire photoelectric converting device.

FIG. 4C is a circuit diagram in which the pixel cell 740 shown in FIGS. 4A and 4B is arranged in a two-dimensional 3×3 matrix.

Referring to FIG. 4C, each of the unit pixel cells 740 is provided with a collector electrode 741 and a sensor electrode 742. The gate electrodes of the PMOS transistors and the capacitor electrodes are commonly connected in each row to driving lines 743, 743', 743", which are connected to a vertical shift register VSR 744. The emitter electrodes are commonly connected in each column to signal reading vertical lines 746, 746', 746", which are respectively connected to switches 747, 747', 747" for resetting the charge in the vertical lines and signal reading switches 750, 750', 750". The gate electrodes of the resetting switches 747, 747', 747" are commonly connected to a terminal 748 for applying a vertical line resetting pulse, and the source electrodes are commonly connected to a terminal 749 for applying a vertical line resetting voltage. The gate electrodes of the readout switches 750, 750', 750" are respectively connected, through lines 751, 751', 751", to a horizontal shift register (HSR) 752, and the drain electrodes are commonly connected, through a horizontal readout line 753, to an output amplifier 757. Said horizontal readout line 753 is also connected to a switch 754 for resetting the charge of said line.

Said resetting switch 754 is connected to a terminal 755 for applying a horizontal line resetting pulse, and a terminal 756 for applying a horizontal line resetting voltage.

The output of the amplifier 757 is obtained from a terminal 758.

In the following, the function of the above-explained circuit will be explained briefly with reference to FIGS. 4A to 4C.

The light entering the light-absorbing layer 214, shown in FIG. 4A, is absorbed therein and generates carriers, which are accumulated in the base area 203.

When a drive pulse released from the vertical shift register appears on the drive line 743, the base potential is elevated through the capacitor, whereby the signal charges, corresponding to the amount of incident light, are obtained from the pixels of the first row to the vertical lines 746, 746', 746".

Then the horizontal shift register 752 releases scanning pulses in succession to the lines 751, 751', 751" to effect on-off control of the 5 switches 750, 750', 750" in succession, whereby the signals are supplied to the output terminal 758 through the amplifier 757. The reset switch 754 is turned on, between the successive on-states of the switches 750, 750', 750", thereby eliminating the remaining charge in the horizontal line 753. Then the vertical line resetting switches 747, 747', 747" are turned on to eliminate the remaining charges in the vertical lines 746, 746', 746". Then the vertical shift register applies a negative pulse to the driving line 743 to turn on the PMOS transistors of the pixels of the first row, thereby eliminating the remaining charges in said pixels and thus initializing said pixels.

Then a drive pulse from the vertical shift register 744 appears on the drive line 743', whereby the signal charges of the pixels of the second row are taken out in a similar manner.

Subsequently the signal charges of the pixels of the third row are taken out in a similar manner. The present device functions by the repetition of the above-explained sequences.

Though the above-explained embodiment employs a circuit structure of the present invention, the device of the present invention may also be applied to the generally known circuits of a photoelectric converting device.

Figure 5:
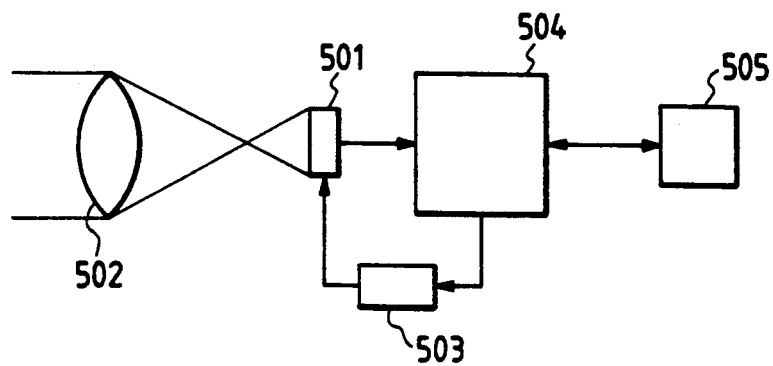
FIG. 5 is a schematic block diagram of an image processing apparatus employing the photoelectric converting device of the present invention.

FIG. 5 shows an example of the image processing apparatus employing the photoelectric converting device shown in FIGS. 4A to 4C.

A photoelectric converting device 501 of the present invention, having photoelectric converting elements arranged in a two-dimensional matrix, effects photoelectric conversion on image information focused by an optical system 502. A driver 503 for driving said device 501 is connected thereto, and output signals bearing said image information are released in response to signals supplied from said driver 503. Said output signals are supplied to a controller 504 for signal processing, and then recorded in various memory (recording) means such as a magnetic tape, a magnetic disk, an optical disk or a semiconductor memory. Said controller 504 also controls the driver 503.

The image processing apparatus of such structure can achieve clear image recording over a prolonged period, without defects in pixels and also without time-dependent deterioration, by the use of the photoelectric converting device of the present invention.

The application of the photoelectric converting device of the present invention is naturally not limited to the image processing apparatus with memory means as shown in FIG. 5. For example it is applicable to the image reader for a facsimile apparatus or a digital copying machine, or to the image pick-up device of a television camera.

As explained in the foregoing, the present invention, allowing one to produce the photoelectric converting device of PIN structure in continuous manner without involving the photolithographic process, prevents the deterioration of device characteristics resulting from the defects conventionally generated at the N/I or P/I interface of the PIN device. Also since the device separation depends on the ratio of conductivity between the microcrystalline doped layer on the pixel electrode and the amorphous doped layer in other areas, it is no longer necessary, as in the conventional process, to etch the entire PIN device, and the device is therefore free from deterioration of characteristics resulting from such etching.

Thus the configuration of the present invention not only dispenses with the device isolation step which has been indispensable in the PIN structure, also prevents the deterioration of device characteristics in the device isolation step, thereby allowing one to obtain a photoelectric converting device with satisfactory device isolating ability and an image processing apparatus utilizing said photoelectric converting device.

What is claimed is:

1. A photoelectric converting device comprising, in sequence:
   (a) a plurality of pixel electrodes provided on a substrate;
   (b) a microcrystalline doping layer of P- or N-conductivity type provided on each of said pixel electrodes;
   (c) an amorphous P- or N-type layer region provided on said substrate between adjacent of said pixel electrodes;
   (d) a photoelectric conversion region having an I-type or substantially I-type layer and an N- or P-type layer; and
   (e) an inter-element region having an I-type or substantially I-type layer and N- or P-type layer.

2. A photoelectric converting device according to claim 1, wherein at least said elements (b) and (c) each contain at least silicon.

3. A photoelectric converting device according to claim 1, wherein said elements (b) and (c) are laminated on the substrate on which at least one of a charge accumulating unit, a driving circuit, a scanning circuit and a read out circuit is formed.

4. A photoelectric converting device according to claim 1, wherein said elements (b) and (c) each contain at least an element selected from the group consisting of Ge, C, O and N.

5. An image processing apparatus comprising at least:
   (i) a photoelectric converting device comprising, in sequence,
      (a) a plurality of pixel electrodes provided on a substrate;
      (b) a microcrystalline doping layer of P- or N-conductivity type provided on each of said pixel electrodes;
      (c) an amorphous P- or N-type layer region provided on said substrate between adjacent of said pixel electrodes;
      (d) a photoelectric conversion region having an I-type or substantially I-type layer and an N- or P-type layer; and
      (e) an inter-element region having an I-type or substantially I-type layer and an N- or P-type layer;
   (ii) an optical system for entering image information into said photoelectric converting device;
   (iii) a driver for driving said photoelectric converting device; and
   (iv) a controller for processing a signal bearing said image information released from said photoelectric converting device.

6. An image processing apparatus according to claim 5, wherein at least said elements (b) and (c) each contain at least silicon.

7. An image processing apparatus according to claim 5, wherein said elements (b) and (c) are laminated on the substrate on which at least one of a charge accumulating unit, a driving circuit, a scanning circuit and a read-out circuit is formed.

8. An image processing apparatus according to claim 6, wherein said elements (b) and (c), each contain at least an element selected from the group consisting of Ge, C, O and N.

* * * * *

UNITED STATES PATENT AND TRADEMARK OFFICE
CERTIFICATE OF CORRECTION

PATENT NO. : 5,245,201
DATED : September 14, 1993
INVENTOR(S) : HIRAKU KOZUKA, ET AL.

It is certified that error appears in the above-identified patent and that said Letters Patent is hereby corrected as shown below:

ON TITLE PAGE

In [56] References Cited, under U.S. PATENT DOCUMENTS,
  insert: --4,962,412  10/1990  Shinohara et al. ... 357/30--.

In [56] References Cited, under FOREIGN PATENT DOCUMENTS:
  insert: --58-40985  3/1983  Japan .
          60-47574   3/1985  Japan .
          61-49569   3/1986  Japan .--.

COLUMN 2

Line 18, "photoelectric" should read --a photoelectric--.
Line 20, "photoelectric" should read --a photoelectric--.
Line 49, "P-or" should read --P- or--.

COLUMN 3

Line 35, "N etc." should read --N, etc.,--.
Line 52, "Ti Mo," should read --Ti, Mo,--.

COLUMN 4

Line 38, "embodiment" should read --embodiment,--.
Line 42, "Also" should read --Also,--.
Line 59, "Thus" should read --Thus,--.
Line 67, "Then" should read --Then,--.

COLUMN 6

Line 1, "5" should be deleted.

UNITED STATES PATENT AND TRADEMARK OFFICE
CERTIFICATE OF CORRECTION

PATENT NO. : 5,245,201
DATED : September 14, 1993
INVENTOR(S) : HIRAKU KOZUKA, ET AL.

It is certified that error appears in the above-identified patent and that said Letters Patent is hereby corrected as shown below:

COLUMN 7

Line 3, "also" should read --but also--.
   Line 33, "read out" should read --read-out--.

COLUMN 8

Line 3, "sequence," should read --sequence:--.
   Line 6, "P-or" should read --P- or--.
   Line 34, "(c)," should read --(c)--.

Signed and Sealed this

Ninth Day of August, 1994

Attest:

BRUCE LEHMAN

Attesting Officer     Commissioner of Patents and Trademarks